United States Patent

Hong et al.

[11] Patent Number: 6,037,234
[45] Date of Patent: Mar. 14, 2000

[54] METHOD OF FABRICATING CAPACITOR

[75] Inventors: Gary Hong, Hsin-Chu; Anchor Chen, Pingtung, both of Taiwan

[73] Assignee: United Semiconductor Corp., Hsin-chu, Taiwan

[21] Appl. No.: 09/023,879

[22] Filed: Feb. 13, 1998

[30] Foreign Application Priority Data

Dec. 24, 1997 [TW] Taiwan ................... 86119673

[51] Int. Cl.[7] ............ H01L 21/8242; H01L 21/20; H01L 21/28; H01L 21/44
[52] U.S. Cl. ............ 438/396; 438/253; 438/387; 438/244; 438/574; 438/579; 438/666; 438/239; 257/308; 257/309; 257/317
[58] Field of Search ............ 438/239, 396, 438/253, 387, 244, 574, 579, 666; 257/308, 309, 317

[56] References Cited

U.S. PATENT DOCUMENTS

| | | | |
|---|---|---|---|
| 5,443,993 | 8/1995 | Park et al. | 438/396 |
| 5,484,744 | 1/1996 | Hong | 437/52 |
| 5,552,334 | 9/1996 | Tseng . | |
| 5,670,410 | 9/1997 | Pan | 438/396 |
| 5,693,554 | 12/1997 | Lee . | |
| 5,726,084 | 3/1998 | Boyd et al. | 438/239 |
| 5,811,344 | 9/1998 | Tu et al. | 438/396 |
| 5,849,617 | 12/1998 | Wu | 438/253 |
| 5,854,119 | 12/1998 | Wu et al. | 438/396 |
| 5,904,565 | 5/1999 | Nguyen et al. | 438/666 |
| 5,943,582 | 8/1999 | Huang et al. | 438/396 |

FOREIGN PATENT DOCUMENTS 41 02 184  8/1991  Germany .
196 10 272  2/1997  Germany .

*Primary Examiner*—Carl Whitehead, Jr.
*Assistant Examiner*—James Park
*Attorney, Agent, or Firm*—Merchant & Gould P.C.

[57] ABSTRACT

A method of fabricating a capacitor in a DRAM. A semiconductor substrate having a metal-oxide-semiconductor is provided. Using only one photolithography process, a bottom electrode is formed. By forming a dielectric layer over the substrate, and a poly-silicon layer on the dielectric layer, a capacitor is formed.

8 Claims, 9 Drawing Sheets

METHOD OF FABRICATING CAPACITOR

CROSS-REFERENCE TO RELATED APPLICATION

This application claims the priority benefit of Taiwan application Ser. No. 86119673, filed Dec. 24, 1997, the full disclosure of which is incorporated herein by reference.

BACKGROUND OF THE INVENTION

1. Field of the Invention

The invention relates to a method of fabricating a dynamic random access memory (DRAM), and more particularly to a method of fabricating a capacitor in a DRAM.

2. Description of the Related Art

Modern semiconductor fabrication technique in an ultra large scale integration (ULSI) highly increases the circuit density on a chip. The increase of circuit density causes the downsizing of devices and the increase of device packing density. Recently, enhanced resolution of photolithography technique, the development of anisotropic plasma etching and other improvements of semiconductor fabrication have all been advantageous to device downsizing. However, in order to develop towards a further higher circuit density, some breakthrough is required for semiconductor fabrication.

DRAM is a device broadly used in electronic industry for data storage due to the characteristic of increased circuit density in an integrated circuit (IC). The stored information or message is determined by the charges stored in an internal capacitor of a memory cell. The access of data is performed by operating the read/write circuit and the peripheral memory in a chip. A single DRAM memory cell comprises a field effect transistor (FET) and a capacitor as a bit for representing a binary data.

As the number of transistors in a DRAM greatly increases, the dimension of the transistors reduces. Thus, during storing charges, a acceptable signal-to-noise (S/N) ratio is difficult to maintain. By decreasing the charges in a capacitor to enhance the S/N ratio, the refresh cycles for storing charges is correspondingly increased.

Being restricted by the limited available surface area of a capacitor in a memory cell, to supply sufficient capacitance to the chip without increasing the occupied space on the substrate, a special and effective capacitor structure is needed to meet the requirement of semiconductor fabrication. As example, a trench capacitor, a cylinder capacitor, and a stack capacitor have been developed and used. However, due to the high complexity of fabrication, the trench capacitor is not as common as the cylinder capacitor and the stack capacitor. The disadvantages of these structures are the complex process and the high cost of fabrication.

In FIG. 3a to FIG. 3g, a conventional method of fabricating a cylinder capacitor in a DRAM is shown.

Referring to FIG. 3a, on a silicon substrate 300 having a metal-oxide-semiconductor (MOS) formed thereon, an oxide layer 301 and a silicon nitride layer 302 are formed in sequence. The silicon nitride layer 302 is used as an etch stop in the subsequent etching process.

In FIG. 3b, using photolithography and etching, the silicon nitride layer 302 and the oxide layer 301 are patterned to form an opening 309, so that the silicon substrate 300 is exposed within the opening 309, for example, a doped region in the MOS is exposed. A poly-silicon layer 303 is formed on silicon nitride layer 302 and fills the opening 309.

In FIG. 3c, the poly-silicon layer 303 is etched back until the surface of the poly-silicon layer and the surface of the silicon nitride layer 302 are at a same level.

In FIG. 3d, an oxide layer 304 is formed over the substrate 300. Using photolithography and etching, the oxide layer 304 is patterned to form an opening 310, so that the poly-silicon layer 303 within the opening 310 and a part of the surface of the silicon nitride layer 302 are exposed. A poly-silicon layer 305 is formed to cover the opening 310 and the oxide layer 304, and thus, the poly-silicon layer 303 and the poly-silicon layer 305 are electrically connected. An oxide layer 306 is formed on the poly-silicon 305.

In FIG. 3e, the oxide layer 306 is etched back with the poly-silicon layer 305 as an etch stop. The poly-silicon layer 305 is etched back with the oxide layer 304 as an etch stop.

In FIG. 3f, the remaining oxide layer 306 and the remaining oxide layer 304 are removed by wet etching with the silicon nitride layer 302 as an etch stop.

In FIG. 3g, an insulation layer 307, for example, an oxide/nitride/oxide (ONO) layer, is formed over the substrate 300. A poly-silicon layer 308 is formed on the insulation layer 307. The fabrication of a conventional cylinder capacitor in a DRAM is formed.

In the above method, two photolithography and etching processes are used, so that two photo-masks are required. Thus, the possibility of misalignment is increased, the process is more complex, and the cost of fabrication is high.

SUMMARY OF THE INVENTION

It is therefore an object of the invention to provide a method of fabricating a capacitor. Using the contact window of the electrode node for self-alignment, only one photolithography and etching process is necessary to perform. The process is simplified and the cost of fabrication is reduced.

It is therefore another object of the invention to provide a method of fabricating a capacitor in a DRAM. The surface of area is increased by using only one photo-mask.

To achieve these objects and advantages, and in accordance with the purpose of the invention, as embodied and broadly described herein, the invention is directed towards a method of fabricating a capacitor. On a semiconductor substrate having a metal-oxide-semiconductor, a first oxide layer, a silicon nitride layer, a second oxide layer and a first poly-silicon layer are formed in sequence. The first poly-silicon layer and the second oxide layer to are patterned form a first opening, so that the silicon nitride layer is exposed within the first opening. A third oxide layer is formed over the substrate. The third oxide layer is etched with the silicon nitride layer as an etch stop. The silicon nitride layer is etched to form a second opening until exposing the first oxide layer by using the remaining third oxide layer and the first poly-silicon layer as masks. The second opening is deepened until the substrate is exposed by etching the first oxide layer. A second poly-silicon layer is formed to cover the first poly-silicon layer and the first opening, and to fill the second opening. A fourth oxide layer is formed on the second poly-silicon layer. The fourth oxide layer, the second poly-silicon layer, and the first poly-silicon layer are removed by chemical-mechanical polishing until the second oxide layer is exposed. The remaining fourth oxide layer and the second oxide layer are wet etched with the silicon nitride layer as an etch stop. An insulation layer is formed over the silicon substrate, and a third poly-silicon layer is formed on the insulation layer.

To achieve the above objects and advantages, and in accordance with the purpose of the invention, another method of fabricating a capacitor is proposed. On a semiconductor substrate having a metal-oxide-semiconductor, a first oxide layer, a silicon nitride layer, a second oxide layer, and a first poly-silicon layer are formed in sequence. The first poly-silicon layer, the second oxide layer, and the silicon nitride layer are etched to form a first opening, so that the first oxide layer is exposed within the first opening. A third oxide layer is formed over the substrate. The third oxide layer and the first oxide layer are etched until the substrate is exposed. A second poly-silicon layer is formed over the substrate. A fourth oxide layer is formed. The second opening is deepened by etching the first oxide layer until the substrate is exposed. A second poly-silicon layer is formed to cover the first poly-silicon layer and the first opening, and to fill the second opening. A fourth oxide layer is formed on the second poly-silicon layer. The fourth oxide layer, the second poly-silicon layer, and the first poly-silicon layer are removed by chemical-mechanical polishing until the second oxide layer is exposed. The remaining fourth oxide layer and the second oxide layer are wet etched with the silicon nitride layer as an etch stop. An insulation layer is formed over the silicon substrate. A third poly-silicon layer is formed on the insulation layer.

It is to be understood that both the foregoing general description and the following detailed description are exemplary and explanatory only and are not restrictive of the invention as claimed.

DESCRIPTION OF THE PREFERRED EMBODIMENTS

FIG. 1a to FIG. 1g show the cross sectional views of the process fabricating a capacitor in a preferred embodiment.

Figure 1A:
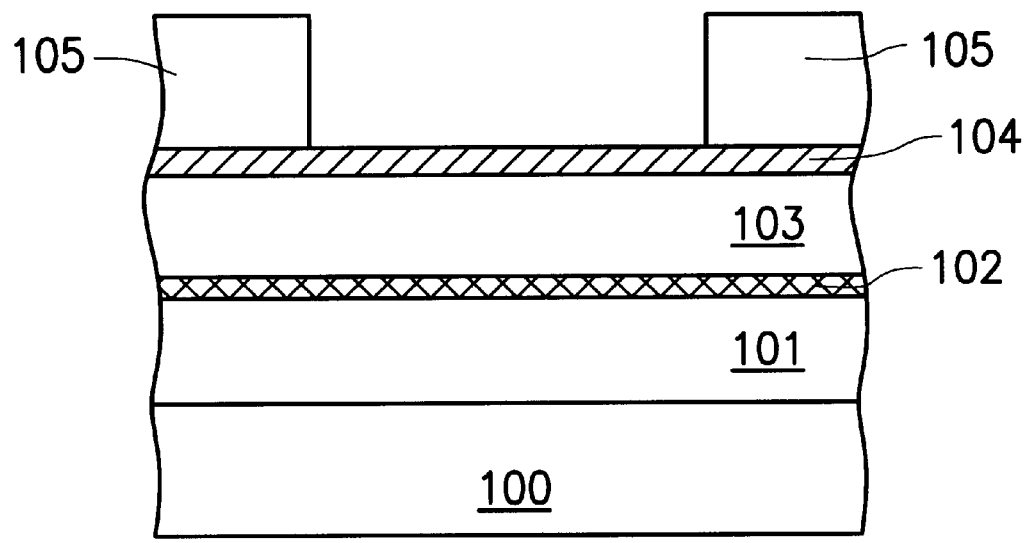
FIG. 1a to FIG. 1g are cross sectional views of the process for fabricating a capacitor in a DRAM in a preferred embodiment according to the invention.

In FIG. 1a, a first oxide layer 101, a silicon nitride layer 102, a second oxide layer 103, and a first poly-silicon layer are 104 formed on a silicon substrate 100 on which an MOS is formed in sequence. A photo-resist layer 105 is formed and patterned on the first poly-silicon layer 104.

Figure 1B:
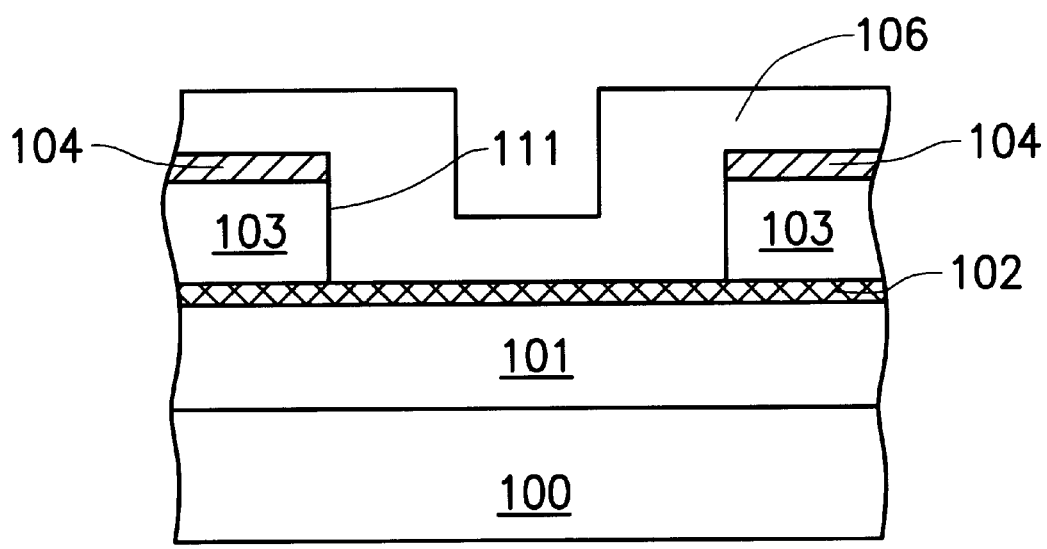

Referring FIG. 1b, the first poly-silicon layer 104 and the second oxide layer 103 are etched to form a first opening 111 with the silicon nitride layer 102 as an etch stop. The photo-resist layer 105 is removed. A third oxide layer 106 is formed over the substrate 100.

Figure 1C:
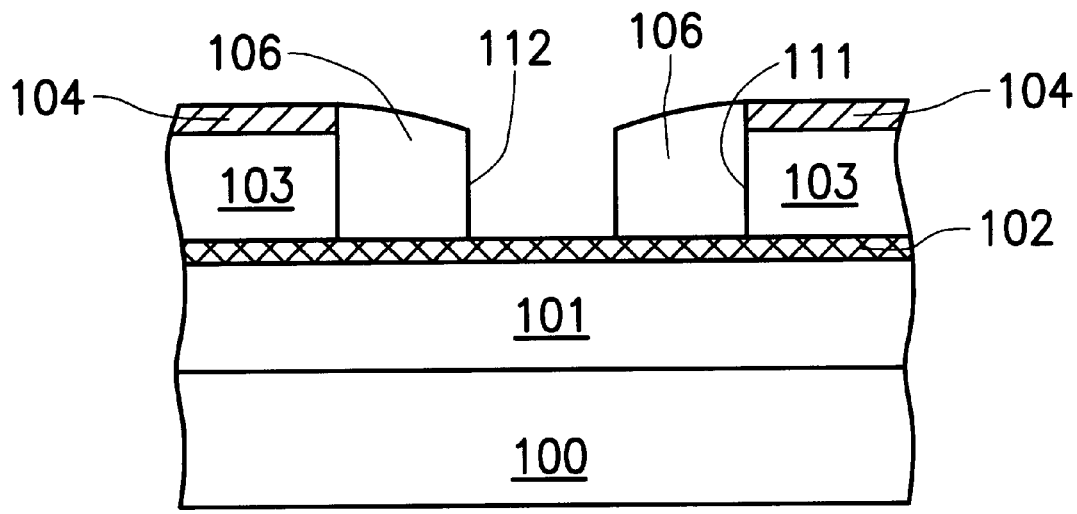

Referring to FIG. 1c, the third oxide layer 106 is etched to form a second opening 112 within the first opening 111 with the silicon nitride layer 102 as an etch stop.

Figure 1D:
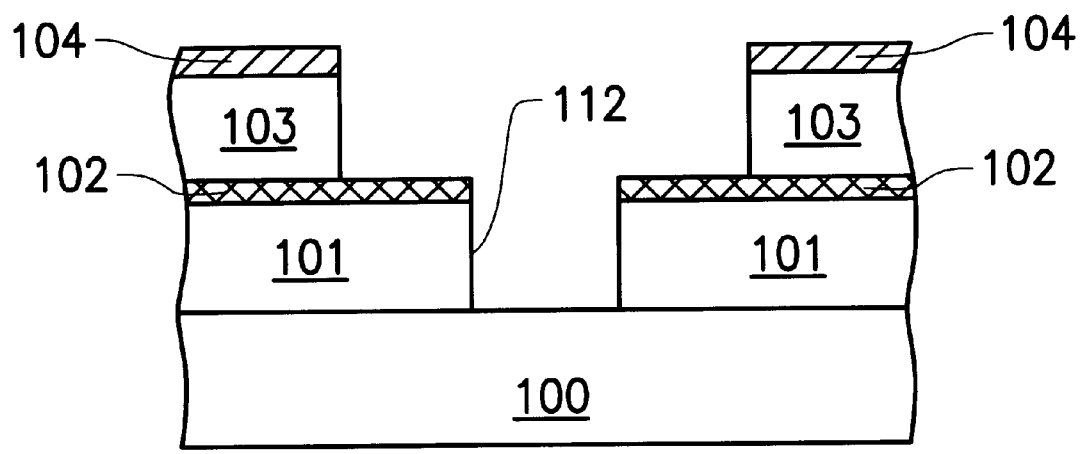

Referring to FIG. 1d, using the etched third oxide layer 106 and the first poly-silicon layer 104 as masks, the silicon nitride layer 102 and the first oxide layer 101 are etched to deepen the second opening 112 and to expose the substrate 100, for example, the exposed doped region of the MOS.

Figure 1E:
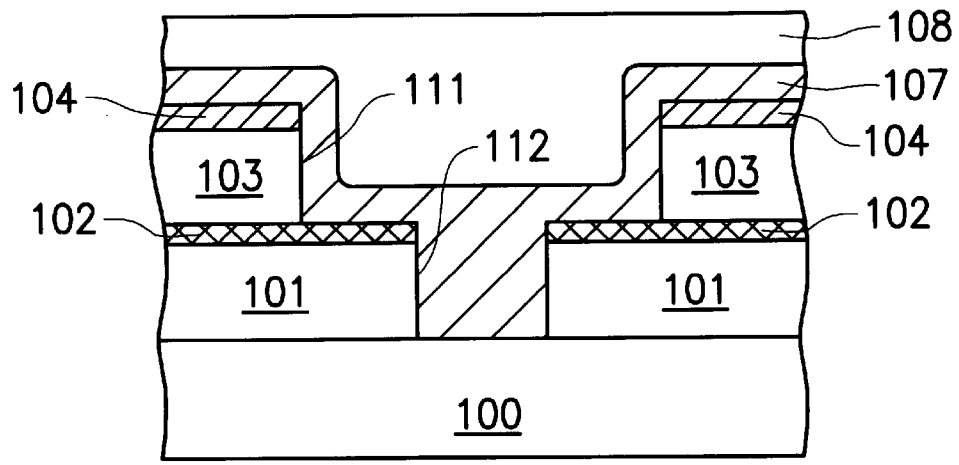

Referring to FIG. 1e, a second poly-silicon layer 107 is formed over the substrate 100 to cover the first poly-silicon layer 104 and the first opening 111, and fills the second opening 112. A fourth oxide layer 108 is formed on the second poly-silicon layer 107.

Figure 1F:
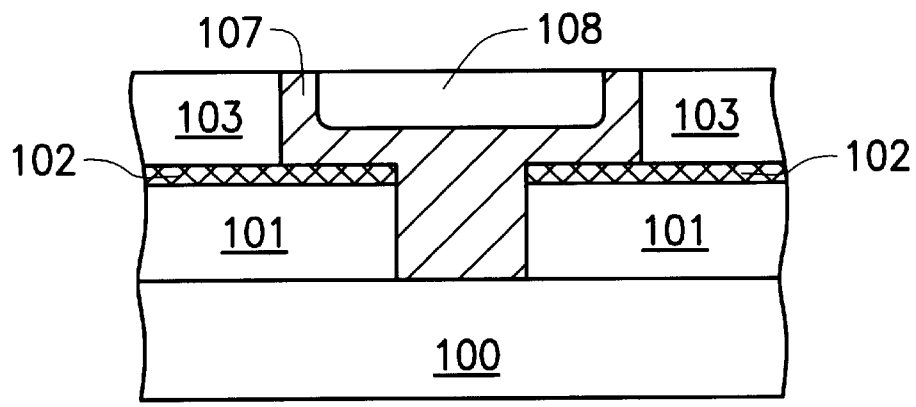

Referring to FIG. 1f, using chemical-mechanical polishing (CMP), the fourth oxide layer 108, the second poly-silicon layer 107, and the first poly-silicon layer 104 are removed to expose the second oxide layer 103.

Figure 1G:
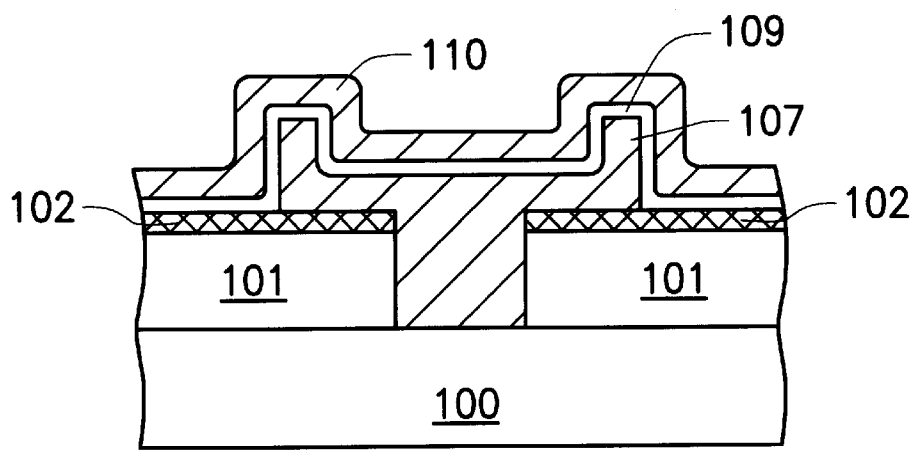

Referring to FIG. 1g, using wet etching, the remaining fourth oxide layer 108 and the remaining second oxide layer 103 are removed with the silicon nitride layer 102 as an etch stop. An insulation layer 109, for example, an ONO layer, is formed over the substrate 100. A third poly-silicon layer 110 is formed on the insulation layer 109 to complete the formation of a capacitor.

Another embodiment of the method of fabricating a capacitor is shown as FIG. 2a to FIG. 2f.

Figure 2A:
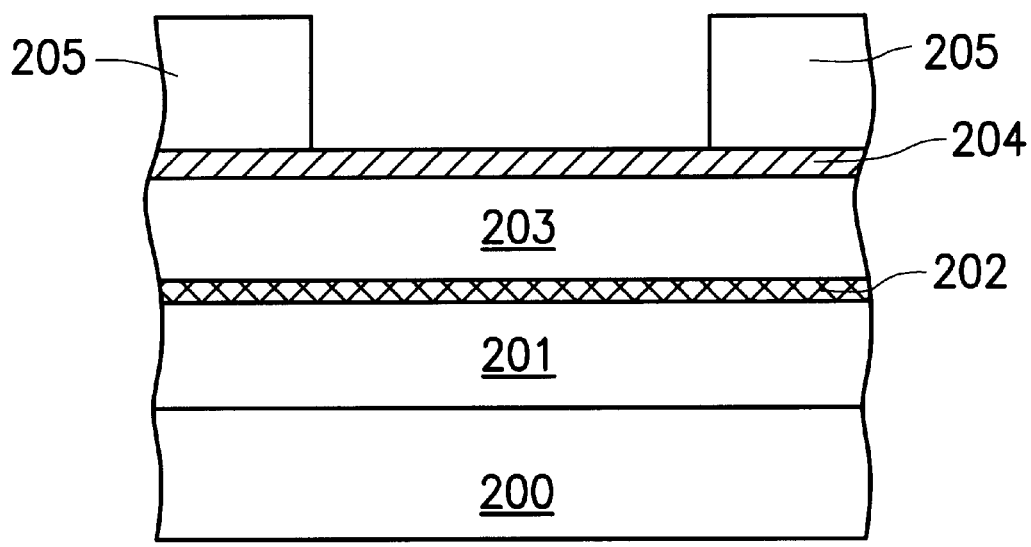
FIG. 2a to FIG. 2f are cross sectional views of the process for fabricating a capacitor in a DRAM in another preferred embodiment according to the invention.

Referring to FIG. 2a, a first oxide layer 201, a silicon nitride layer 202, a second oxide layer 203, and a first poly-silicon layer 204 are formed on a silicon substrate 200 on which an MOS is formed in sequence. A photo-resist layer 205 is formed and patterned on the first poly-silicon layer 204.

Figure 2B:
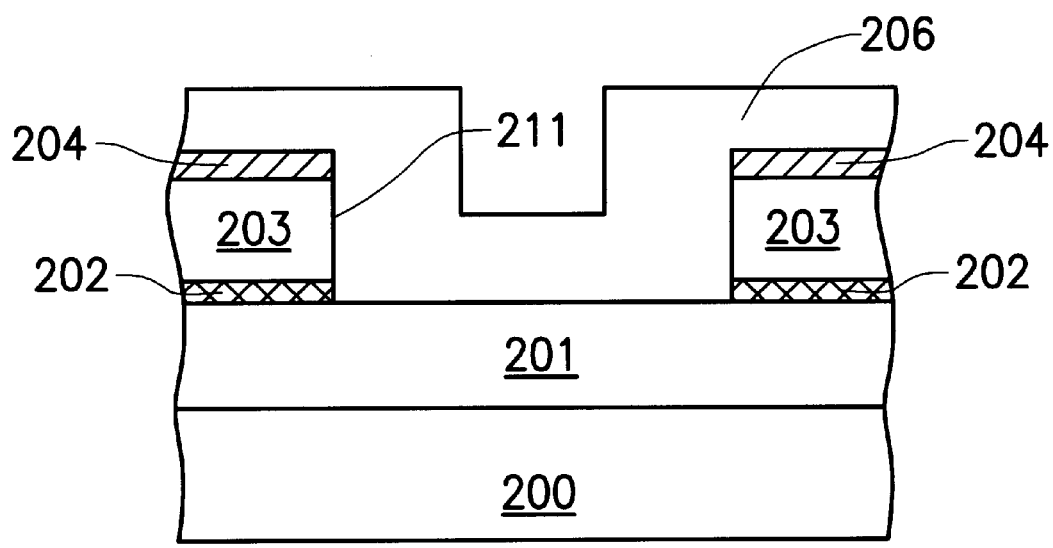

Referring FIG. 2b, the first poly-silicon layer 204, the second oxide layer 203, and the silicon nitride layer 202 are etched to form a first opening 211 with the first silicon oxide layer 201 as an etch stop. The photo-resist layer 205 is removed. A third oxide layer 206 is formed over the substrate 200 and fills the opening 211.

Figure 2C:
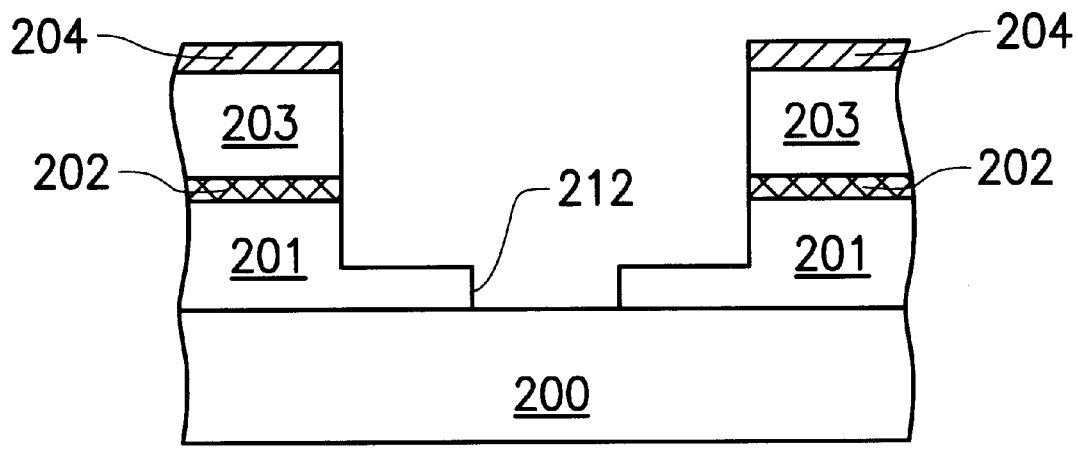

Referring to FIG. 2c, the third oxide layer 206 and the first oxide layer 201 are etched to form a second opening 212 within the first opening 211 until exposing the substrate 200, for example, exposing the doped region of the MOS.

Figure 2D:
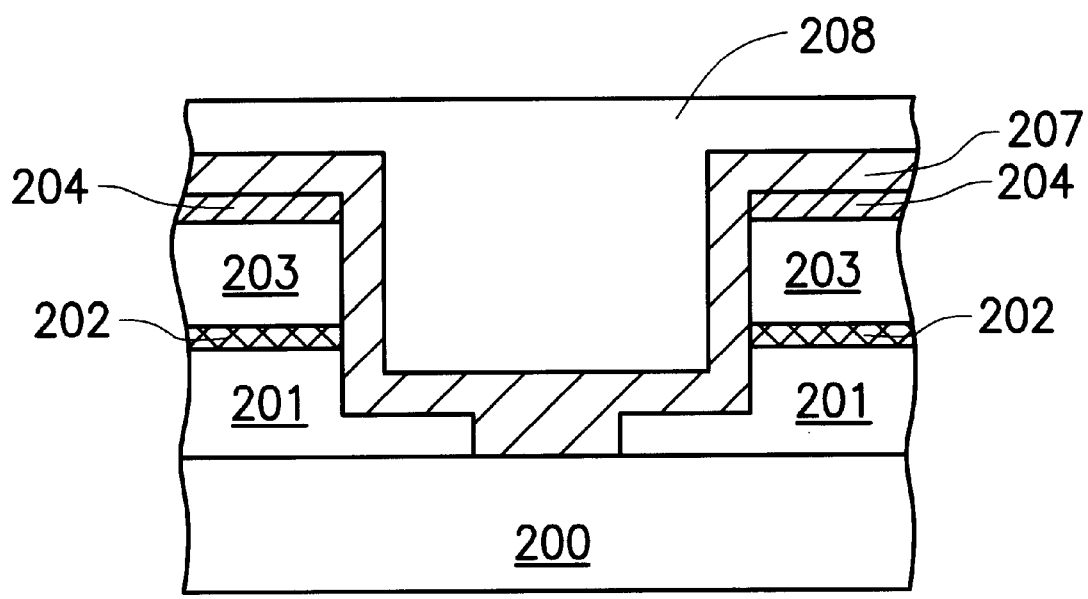

Referring to FIG. 2d, forming a second poly-silicon layer 207 over the substrate 200 and the first opening 211, and fills the second opening 212. A fourth oxide layer 208 is formed on the second poly-silicon layer 207.

Figure 2E:
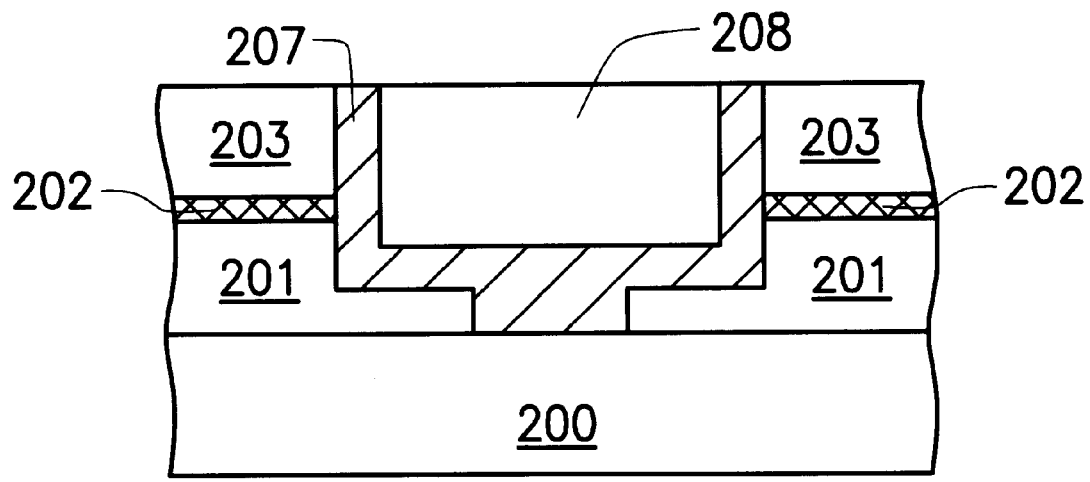

Referring to FIG. 2e, using CMP, the fourth oxide layer 208, the second poly-silicon layer 207, and the first poly-silicon layer 204 are removed until the second oxide layer 203 is exposed.

Figure 2F:
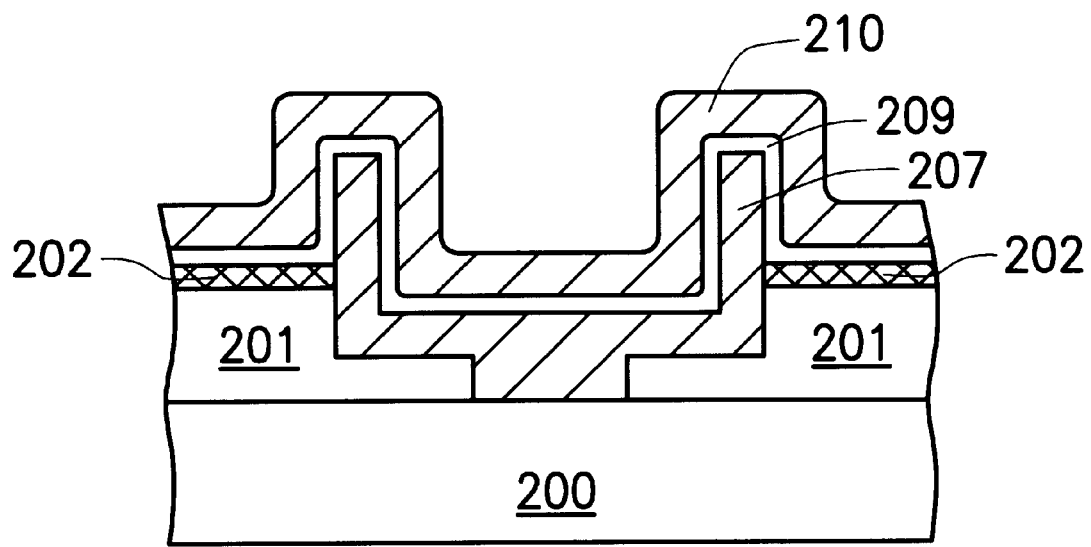
Figure 3A:
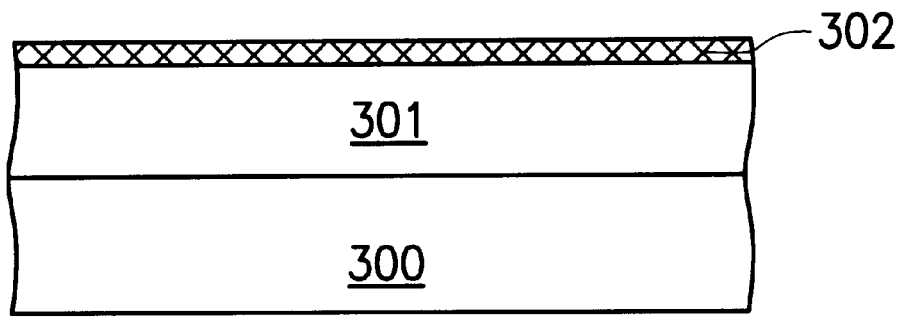
FIG. 3a to FIG. 3g are cross sectional views of the conventional process for fabricating a cylinder capacitor.
Figure 3B:
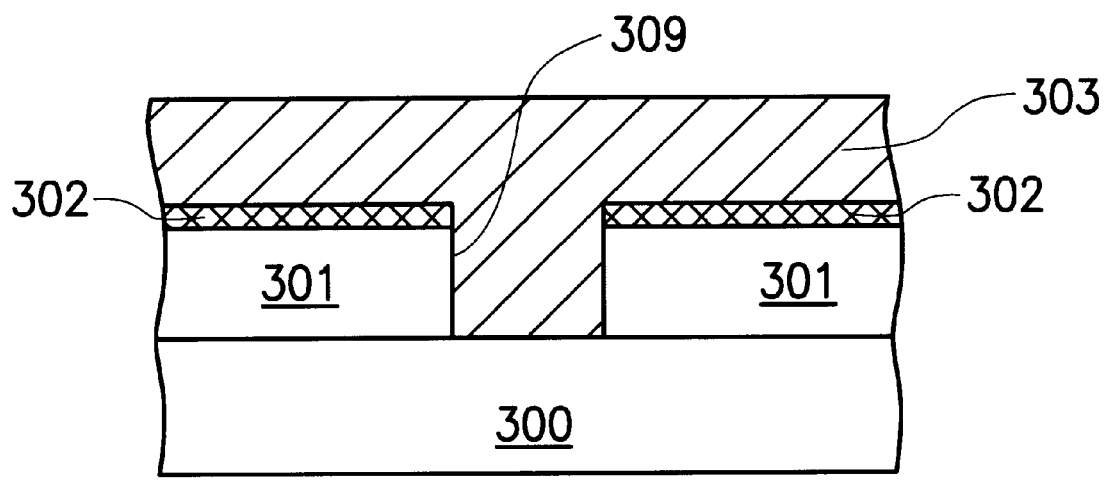
Figure 3C:
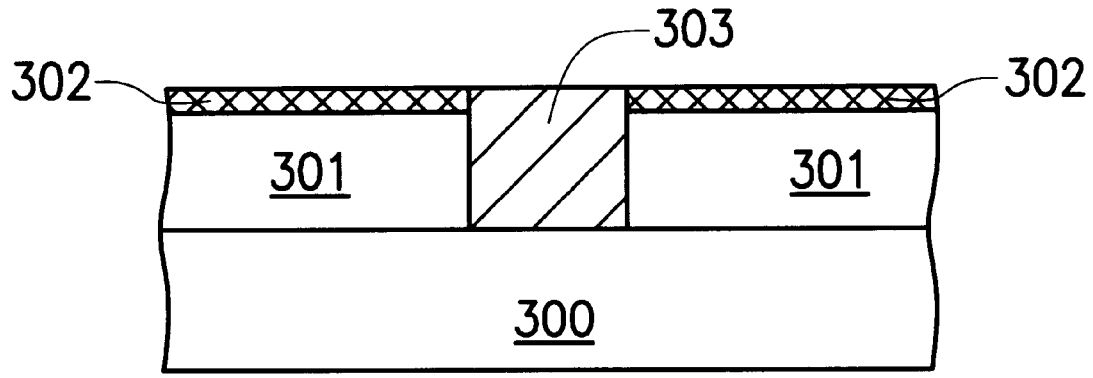
Figure 3D:
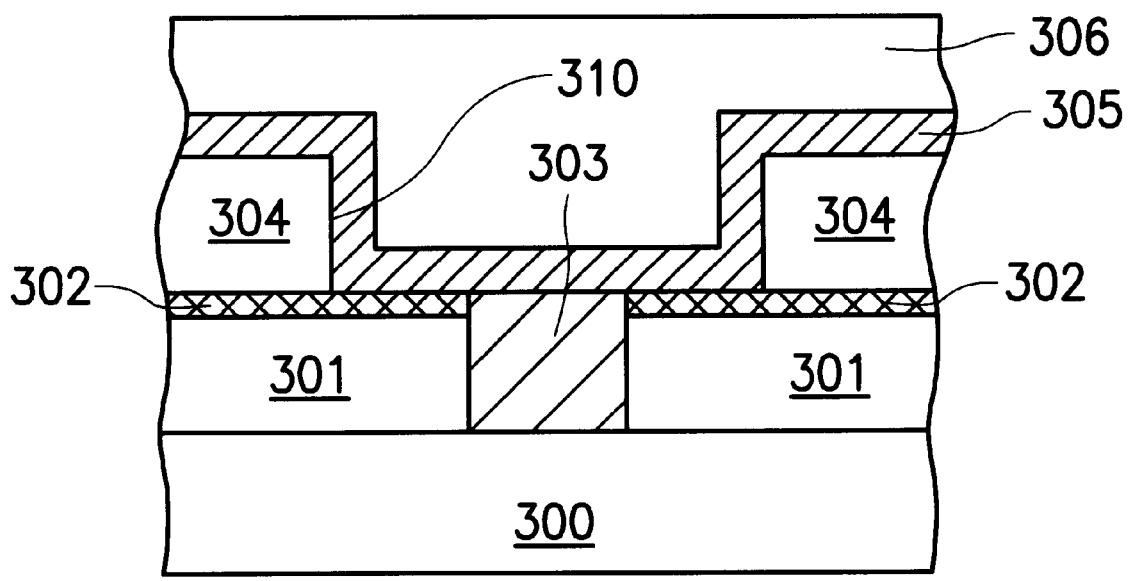
Figure 3E:
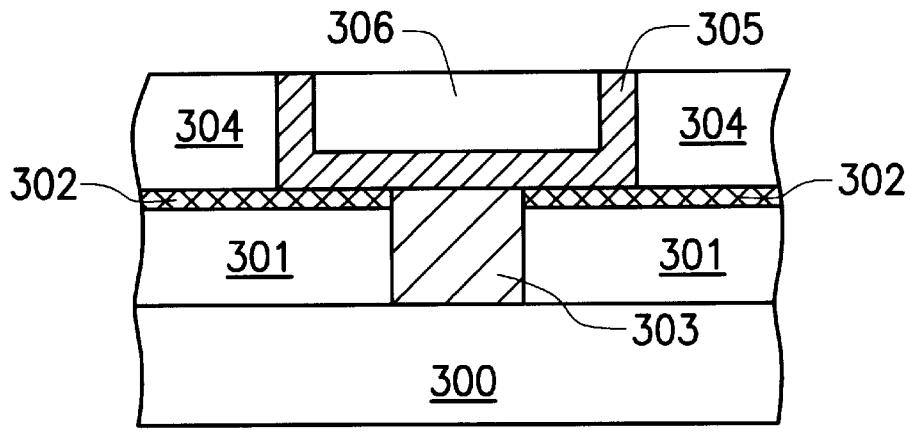
Figure 3F:
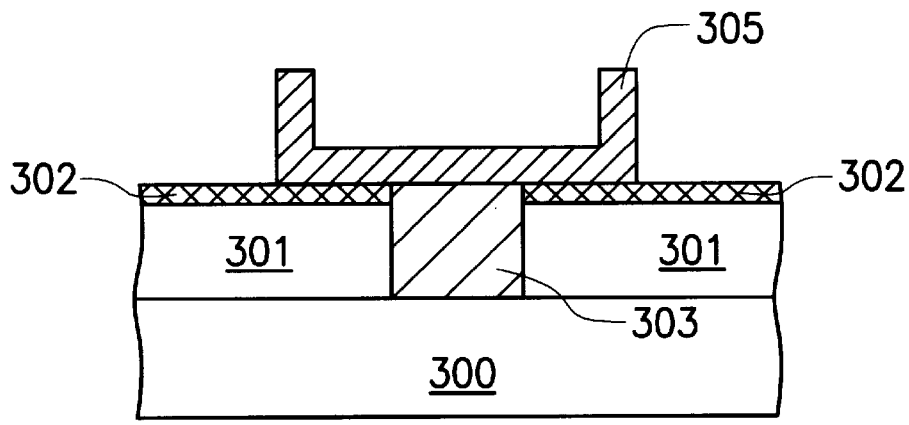
Figure 3G:
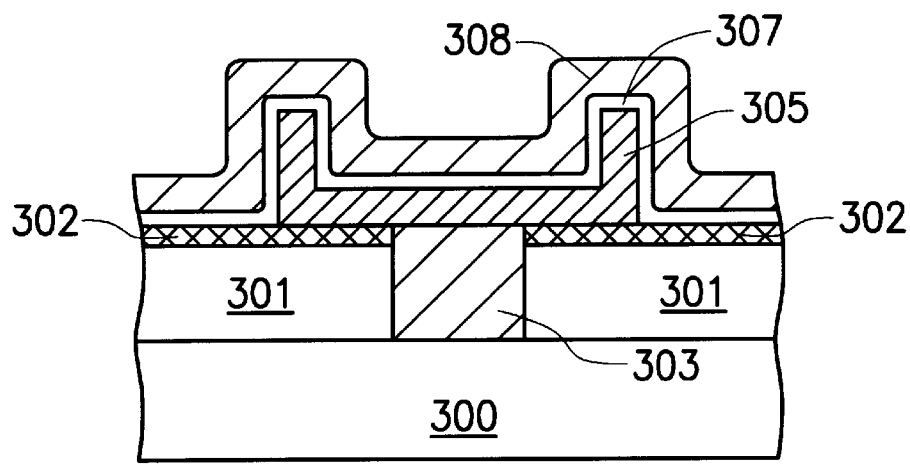

Referring to FIG. 2f, using wet etching, the remaining fourth oxide layer 208 and the remaining second oxide layer 203 are removed with the silicon nitride layer 202 as an etch stop. An insulation layer 209, for example, an ONO layer, is formed over the substrate 200. A third poly-silicon layer 210 is formed on the insulation layer to complete the formation of a capacitor.

In the first embodiment, the bottom electrode covers a part of the surface of the silicon nitride layer. Whereas, in the second embodiment, a part of the silicon nitride layer is removed, and the bottom electrodes further occupies the space which was occupied by the part of the the silicon nitride before being removed. Therefore, the surface area of the bottom electrode of a capacitor is even larger in the second embodiment.

A capacitor fabricated by a process according to the invention has the following advantages as follows:

1. The node contact window of a bottom electrode in a capacitor is self-aligned, and only one photolithography process is required. Therefore, the misalignment is eliminated, and the cost is reduced.
2. The surface area of the capacitor is increased, thus, the capacitance of the DRAM is increased.

Other embodiment of the invention will appear to those skilled in the art from consideration of the specification and practice of the invention disclosed herein. It is intended that the specification and examples considered as exemplary only, with the true scope and spirit of the invention being indicated by the following claims.

What is claimed is:

1. A method of fabricating a capacitor, wherein a semiconductor substrate having a metal-oxide-semiconductor is provided, comprising:

forming a first oxide layer, a silicon nitride layer, a second oxide layer, and a first poly-silicon layer on the substrate in sequence;

patterning the first poly-silicon layer and the second oxide layer to form a first opening, so that the silicon nitride layer within the first opening is exposed;

forming a third oxide layer over the substrate;

etching the third oxide layer with the silicon nitride layer as an etch stop;

etching the silicon nitride layer to form a second opening the first oxide layer is exposed, using the remaining third oxide layer and the first poly-silicon layer as masks;

deepening the second opening by etching the first oxide layer until the substrate is exposed;

forming a second poly-silicon layer to cover the first poly-silicon layer and the first opening, and to fill the second opening;

forming a fourth oxide layer on the second poly-silicon layer;

removing the fourth oxide layer, the second poly-silicon layer, and the first poly-silicon layer until the second oxide layer is exposed;

wet etching the remaining fourth oxide layer and the second oxide layer with the silicon nitride layer as an etch stop;

forming an insulation layer over the silicon substrate; and forming a third poly-silicon layer on the insulation layer.

2. The method according to claim 1, wherein the second opening exposes a doped region of the metal-oxide-semiconductor.

3. The method according to claim 1, wherein the insulation layer includes a silicon oxide/silicon nitride/silicon oxide layer.

4. The method according to claim 1, wherein the fourth oxide layer, the second poly-silicon layer, and the first poly-silicon layer are removed by chemical-mechanical polishing.

5. A method of fabricating a capacitor, wherein a semiconductor substrate having a metal-oxide-semiconductor is provided, comprising:

forming a first oxide layer, a silicon nitride layer, a second oxide layer, and a first poly-silicon layer on the substrate in sequence;

patterning the first poly-silicon layer, the second oxide layer, and the silicon nitride layer to form a first opening, so that the first oxide layer within the first opening is exposed;

forming a third oxide layer over the substrate;

etching the third oxide layer and the first oxide layer to form a second opening to expose the substrate;

forming a second poly-silicon layer over the substrate;

forming a fourth oxide layer on the second poly-silicon layer;

removing the fourth oxide layer, the second poly-silicon layer, and the first poly-silicon layer until the second oxide layer is exposed;

wet etching the remaining fourth oxide layer and the second oxide layer with the silicon nitride layer as an etch stop;

forming an insulation layer over the silicon substrate; and forming a third poly-silicon layer on the insulation layer.

6. The method according to claim 5, wherein the second opening exposes a doped region of the metal-oxide-semiconductor.

7. The method according to claim 5, wherein insulation layer includes a silicon oxide/silicon nitride/silicon oxide layer.

8. The method according to claim 5, wherein the fourth oxide layer, the second poly-silicon layer, and the first poly-silicon layer are removed by chemical-mechanical polishing.

* * * * *